US008749091B2

(12) United States Patent
Skarani et al.

(10) Patent No.: US 8,749,091 B2
(45) Date of Patent: Jun. 10, 2014

(54) BATTERY EMULATOR AND METHODS OF USE

(75) Inventors: Glenn G. Skarani, Ormond Beach, FL (US); Craig Bishop, Boca Raton, FL (US)

(73) Assignee: Forward Thinking Products, LLC, Ormond Beach, FL (US)

( * ) Notice: Subject to any disclaimer, the term of this patent is extended or adjusted under 35 U.S.C. 154(b) by 447 days.

(21) Appl. No.: 12/956,449

(22) Filed: Nov. 30, 2010

(65) Prior Publication Data

US 2011/0127831 A1 Jun. 2, 2011

Related U.S. Application Data

(60) Provisional application No. 61/264,975, filed on Nov. 30, 2009.

(51) Int. Cl.
*B60L 1/00* (2006.01)
*B60L 3/00* (2006.01)
*H02G 3/00* (2006.01)
*H02J 7/14* (2006.01)

(52) U.S. Cl.
USPC .......................... 307/10.1; 307/9.1; 320/104

(58) Field of Classification Search
None
See application file for complete search history.

(56) References Cited

U.S. PATENT DOCUMENTS

| 4,218,717 A | 8/1980 | Shuster |
| 4,698,748 A | 10/1987 | Juzswik et al. |
| 5,075,627 A | 12/1991 | Bodig et al. |

(Continued)

FOREIGN PATENT DOCUMENTS

| EP | 2234278 A1 | 9/2010 |
| JP | 61153570 | 7/1986 |

OTHER PUBLICATIONS www.lindelectronics.com; LIND Power Conversion Specialists for the Mobile Environment, Shut Down Timers & Laptop Accessories; <<http://www.lindelectronics.com/cgi-bin/store/shop.cgi/!ORDERID!/other/x/dbx_gen_port_acc/>> (last visited on Mar. 17, 2011).

(Continued)

*Primary Examiner* — Jared Fureman
*Assistant Examiner* — Aqeel Bukhari
(74) *Attorney, Agent, or Firm* — Cuenot, Forsythe & Kim, LLC

(57) ABSTRACT

A dynamic battery emulator for replacing and mimicking the characteristics of a battery in a portable electronic device when the device is located in or on a vehicle can include a power control module capable of varying its output voltage to adapt to the voltage requirements of an attached portable electronic device; an input for conveying electrical power from the vehicle's electrical system to the power control module; an output for providing electrical power to the portable electronic device; an output for communicating a control signal from the power adaptor to the portable electronic device to selectively turn on and off the portable electronic device; a battery replacement module configured to replace the battery in a portable electronic device and including battery replacement circuitry for transferring electrical power from the power control module to the portable electronic device via the output for providing electrical power; an ignition sense controller for determining the power state of the vehicle's electrical system; and in communication with the ignition sense controller, at least one timer and switch for reducing the conveyance of electrical power from the vehicle's electrical system to the portable electronic device at a predetermined time after the vehicle's ignition or electrical system is turned off.

18 Claims, 7 Drawing Sheets

(56) References Cited

U.S. PATENT DOCUMENTS

| | | | |
|---|---|---|---|
| 5,081,586 A | 1/1992 | Barthel et al. | |
| 5,200,688 A | 4/1993 | Patino et al. | |
| 5,212,836 A | 5/1993 | Matsushita | |
| 5,659,594 A | 8/1997 | Toda | |
| 5,661,651 A | 8/1997 | Geschke et al. | |
| 5,786,789 A | 7/1998 | Janky | |
| 5,995,813 A | 11/1999 | Ishikura et al. | |
| 6,037,744 A | 3/2000 | Rhodes | |
| 6,055,479 A | 4/2000 | Kirkhart et al. | |
| 6,059,843 A | 5/2000 | Kirkhart | |
| 6,163,690 A | 12/2000 | Lilja | |
| 6,232,743 B1 * | 5/2001 | Nakanishi | 320/104 |
| 6,282,495 B1 | 8/2001 | Kirkhart et al. | |
| 6,393,573 B1 | 5/2002 | Gillespie et al. | |
| 6,516,421 B1 | 2/2003 | Peters | |
| 6,598,168 B1 | 7/2003 | Chen | |
| 6,738,914 B2 | 5/2004 | Christopher | |
| 6,756,697 B2 | 6/2004 | Mizutani et al. | |
| 6,785,595 B2 | 8/2004 | Kominami et al. | |
| 6,838,783 B2 | 1/2005 | Stierle et al. | |
| 7,586,291 B2 | 9/2009 | Keppeler | |
| 7,596,366 B2 | 9/2009 | Van Bosch et al. | |
| 7,610,035 B2 | 10/2009 | Van Bosch et al. | |
| 7,660,133 B1 * | 2/2010 | Hwang et al. | 363/16 |
| 2004/0075345 A1 | 4/2004 | Yoshioka et al. | |
| 2004/0174147 A1 * | 9/2004 | Vinciarelli | 323/266 |
| 2005/0200333 A1 | 9/2005 | Khau | |
| 2006/0133099 A1 | 6/2006 | Thannikary et al. | |
| 2006/0181034 A1 * | 8/2006 | Wilde et al. | 280/5.515 |
| 2007/0182248 A1 | 8/2007 | Blaker et al. | |
| 2008/0091316 A1 | 4/2008 | Szczublewski | |
| 2008/0271937 A1 | 11/2008 | King et al. | |

OTHER PUBLICATIONS www.tessco.com; TESSCO Voltage Inverters & Converters; <<http://www.tessco.com/products/headerProductSearch.do?searchType=1&searchField=1&searchText=voltage+inverters>> (last visited on Mar. 17, 2011).

International Search Report for International Application No. PCT/US2010/058336, mailed on May 18, 2011 (3 pages).

Written Opinion for International Application No. PCT/US2010/058336, mailed on May 18, 2011 (4 pages).

Extended European Search Report for European Patent Application No. 10834031.6, dated Oct. 17, 2013 (4 pages).

* cited by examiner

BATTERY EMULATOR AND METHODS OF USE

CROSS-REFERENCE TO RELATED APPLICATIONS

The present application claims the priority of U.S. provisional patent application Ser. No. 61/264,975, entitled "Supplying External Power and Controlling a Communication Device" and filed on Nov. 30, 2009.

FIELD OF THE INVENTION

The present invention relates to the field of electronics and communications. More particularly, the invention relates to battery emulators for use with accessory electronic devices in cars, trucks, and other mobile vehicles.

BACKGROUND

Portable, battery-operated, electronic devices such as cell phones, media players, and location tracking devices are ubiquitous in today's world. To power or recharge these devices in a vehicle, power adaptors that connect a vehicle's electrical system directly to a portable device can be used. When the vehicle is operating or active, the electrical load on the vehicle from the power adapter and electronic device is small compared to the overall electrical demands from the vehicle itself. When the vehicle is not operating or inactive, however, and the power adapter and electronic device are left on, there will be a continual and significant drain on the vehicle's battery. To prevent depletion of a vehicle's battery, power adaptors have been designed to sense when a vehicle's ignition is turned to the off position, and then either turn off the device or drastically reduce its power consumption.

SUMMARY

The present invention was made during the development of a low-cost system for tracking a fleet of vehicles using off-the-shelf portable, battery-operated, electronic devices such as global positioning system (GPS)-enabled location tracking devices or cell phones. Conventional power adaptors are not suited for this purpose for several reasons. First, conventional batteries used in conjunction with charger adapters wear out over years of use and can lose capacity in the harsh conditions associated with installation in a vehicle (e.g., extreme cold or heat, vibration, etc.). Second, after a vehicle's ignition is turned off, conventional batteries used in conjunction with charger adapters do not allow data acquisition and transmission by the device to be completed before the device is turned completely off to prevent the vehicle's battery from being drained. Third, conventional batteries used in conjunction with charger adapters are not able to be used with portable electronic devices in different vehicles because of the large variations in the ignition state and power supplied by different vehicles (which may range from 6-40V), as well as the inherent noise, spikes, and surges associated with each vehicle's electrical systems. For example, electrical systems utilized in different vehicles can range from 6 to over 40V and are prone to electrical noise. Fourth, conventional batteries used in conjunction with charger adapters do not provide the very clean type of electrical power required for using vehicle-installed portable devices for tracking or monitoring in the real-world setting. For example, where a transceiver of a vehicle-mounted electronic device communicates to a cell tower or other apparatus, the device draws a large current and needs to be low output impedance for the transmission; but then needs to immediately shut the transmitter off and turn the receiver on to receive a signal. Without a very clean power supply to prevent any noise from interfering with the received data, this would not be possible.

To overcome these issues, the inventors used a great deal of ingenuity and effort to develop a battery emulator that replaces and mimics the characteristics of a portable electronic communication device's battery (e.g., impedance, voltage, current, and capacitance). In one embodiment, the battery emulator uses an analog to digital converter compatible with any vehicle having an electrical system (e.g., airplane, boat, motorcycle, electric car, golf cart, industrial equipment, forklifts, etc.) and a timer that allows a coupled portable electronic device to complete acquisition and logging (local storage or transmission to a distant server) of data before signaling the device to power down. Unlike a conventional power adaptor, a battery emulator of the invention can allow deterministic power levels (the voltage output can be changed depending on signaling and an internal algorithm), full "ON"/"OFF" control to prevent excessive power drain from a vehicle's power system, filtering to remove noise out of the supplied power, fast (e.g., less than 1000, 900, 800, 700, 600, 500, 400, 200, or 100 nanoseconds) response to transient loads, surges, and spikes from a vehicle's power system and portable device load conditions. Importantly, regardless of the vehicle it is used with, it also can supply the proper characteristics to emulate the replaced battery's impedance, current, and voltage so that the portable device operates as if a real battery were attached to it (e.g., optimal performance for GPS-enabled devices, cell phones, and other noise and power sensitive electronic portable devices, especially those with wireless data transceivers—which are sensitive to power supply noise). Thus in one embodiment, the battery emulator of the invention can operate in conjunction with a vehicular electrical system operating between 6V-30V (in a very noisy environment) to regulate the electrical power down to a low-impedance (e.g., less than 1, 0.9, 0.8, 0.7, 0.6, 0.5, 0.4, 0.3, 0.2, 0.1, or 0.05 ohms) low voltage (e.g., about or less than 6, 5, 4, 3, or 2 V; about 3.7 or 5.7 V; or between 1.5-38V) to emulate a real lithium ion or similar battery using a switching regulator optimized for low-noise, low output impedance, and additional filtering components to filter out the inherent switching frequency noise.

A battery emulator of the invention can employ circuitry to protect from energy spikes that can occur from the vehicle's power system (e.g., the reverse electro-motive force from an alternator, generators in an electric vehicle, regenerative braking or similar systems). The battery emulator can also include a power adapter and signaling circuitry that limits the power delivered to a device to prevent overloading its charger and power system, provides the proper power up signaling as the replaced battery, and prevents over-driving the signaling that could damage the internal circuitry of the device. It might also include circuitry that can prevent dangerous short-circuit conditions and excessive heat in the event of a failure while sourcing power to a portable electronic device, and allow the battery emulator to resume proper operation once the failed condition is removed.

Accordingly, in one aspect, the invention features a dynamic battery emulator for replacing and mimicking the characteristics of a battery in a portable electronic device when the device is located in or on a vehicle. The dynamic battery emulator can include a power control module capable of varying its output voltage to adapt to the voltage requirements of an attached portable electronic device; an input for conveying electrical power from the vehicle's electrical system to the power control module; an output for providing electrical power to the portable electronic device; an output for communicating a control signal from the power adaptor to the portable electronic device to selectively turn on and off the portable electronic device; a battery replacement module configured to replace the battery in a portable electronic device and including battery replacement circuitry for transferring electrical power from the power control module to the portable electronic device via the output for providing electrical power; an ignition sense controller for determining the power state of the vehicle's electrical system; and in communication with the ignition sense controller, at least one timer and switch for reducing the conveyance of electrical power from the vehicle's electrical system to the portable electronic device at a predetermined time after the vehicle's ignition or electrical system is turned off. When connected to the portable electronic device and the vehicle's electrical system, the battery emulator can provide electrical power to the portable electronic device of same or about the same (e.g., +/−no more than 10, 9, 8, 7, 6, 5, 4, 3, 2, or 1%) voltage, impedance, current, and capacitance as the portable electronic device's battery, and the delivered voltage and impedance varies less than 3, 2, 1, or 0.5% during normal operation of the battery emulator.

The battery replacement module can convey power from the power control module to terminals within the portable electronic device that are configured to receive electrical power from the portable electronic device's battery. The ignition sense controller can include an analog to digital converter for determining the power state of the vehicle's electrical system. In cases where the vehicle's electrical power system includes an ignition system, the dynamic battery emulator can include discrete circuitry which limits transmission of voltage spikes from the ignition system. The dynamic battery emulator can be configured to operate with a portable electronic device that includes a location detection system. The timer's predetermined time can be set to allow the portable electronic device to complete its pending data transfer operations before reducing the conveyance of electrical power from the vehicle's electrical system to the portable electronic device. The dynamic battery emulator can also include and be controllable by a microprocessor which can be controlled by a stimulus or an algorithm. In a preferred designed, the battery emulator draws very little current (e.g., less than 10, 5, 4, 3, 2, 1 mA, and preferably less than 0.5 mA) from an external electrical system (e.g., a mobile vehicle's battery) when the vehicle is not operating.

In another aspect, the invention features a vehicle that includes a dynamic battery emulator connected to the vehicle's electrical system.

In addition, the invention features a method including the steps of: connecting a battery emulator to a vehicle's electrical system; removing a battery from a battery slot of a portable electronic device; and installing the battery emulator into the battery slot of a portable electronic device.

The invention also includes systems that use a battery emulator.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In the case of conflict, the present specification, including definitions will control. In addition, the materials, methods, and examples are illustrative only and not intended to be limiting. Other features and advantages of the invention will be apparent from the following detailed description, and from the claims.

DETAILED DESCRIPTION

Detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting but rather to provide an understandable description of the invention.

Figure 1:
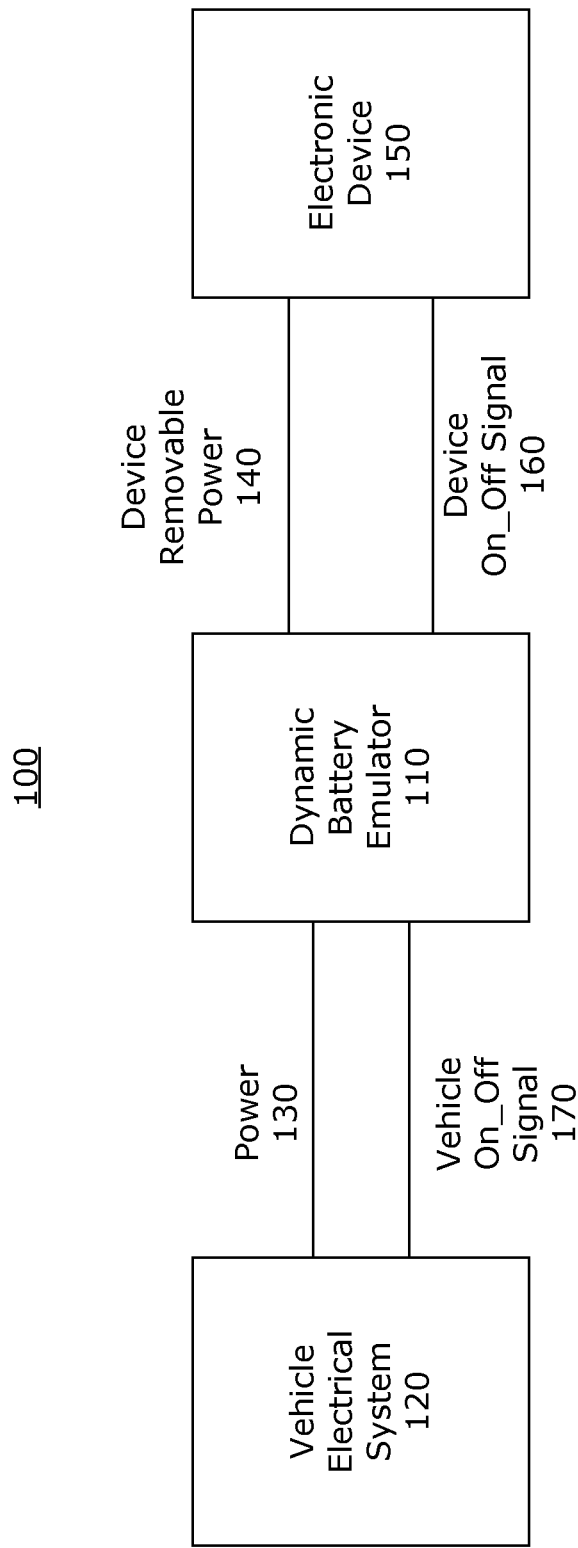
FIG. 1 depicts an electronic system that is useful for understanding the present invention.

FIG. 1 depicts an electronic system 100 which includes a dynamic battery emulator 110 which may be connected to a vehicle electrical system 120 to receive power 130 and supply removable power 140 to operate an electronic device 150. In addition, the battery emulator 110 also may communicate on_off signals 160 to the electronic device 150 to selectively turn on and turn off the electronic device when appropriate. The battery emulator 110 can also monitor the state of the vehicle's ignition, for instance, by monitoring a vehicle on_off signal 170, as well as a power cycle state of the electronic device 150, and process such information in order to determine when to supply power to the electronic device 150. Further, the battery emulator 110 can automatically initiate power-on and power-off sequences in the electronic device 150 based on various conditions or states being monitored. The battery emulator 110 can emulate and replace the battery in the electronic device 150, as well as prevent the electronic device 150 from overly depleting a vehicle's battery. The battery emulator 110 also can eliminate the need for user interaction to turn on and turn off the electronic device 150 at appropriate times.

Based on the ignition state of the vehicle and the power on/off current state of the electronic device 150, the dynamic battery emulator 110 can determine whether the last powering off of the electronic device 150 was due to a change in the vehicle's state. Accordingly, if the vehicle's power on/off state has been determined to be in a powered on state, using an algorithm, a microcontroller can initiate signaling to power on the electronic device. If the vehicle is in a powered off state, using the algorithm, the microcontroller sets a timer and continues to monitor the vehicle's power state. If the vehicle's state does not change at the expiration of this timer (which can be set for any amount of time, e.g., about or no more than 10, 20, 30, 45, 60, 120, 240, 480, 1000, 2000, 5000, or 10,000 seconds; 6, 12, 18, or 24 hours; or 2, 3, 4, or 5 days) the electronic device is shut off (although the microcontroller continues to monitor the vehicle state for any change in a very low power mode). If a change of state is detected and the timer has not expired (the vehicle's power state was determined to be on), the timer is reset, and the electronic device is left in the powered on state. Again, using the algorithm, the microcontroller continues to monitor the vehicle for a change in power state.

In addition to the aforementioned algorithm, inputs from the electronic device to the microcontroller and associated circuitry (in the dynamic battery emulator) determine whether the electronic device is in the powered state. If the electronic device is determined to be in the on state, then the signaling to power up the electronic device is not sent or initiated. This signaling could be as simple as activating a switch or as complex as specific waveforms or signaling to the electronic device. For example, a cellular phone might require a specific timed waveform or signaling to power the device from the dynamic battery emulator. If the vehicle's power on/off state has transitioned from a previously on state to the off state, a programmable timer is set and the algorithm is used to continue monitoring for a change in vehicle power on/off state. Upon expiration of the timer with no change in vehicle state, the signaling will be sent to turn off the electronic device and turn off the battery emulator circuitry to save current drain from the vehicle's battery or similar power supply. Again, the microcontroller continually monitors the state of the vehicle for a change in state relative to its current state. During this vehicle's off state, the dynamic battery emulator is placed in a low-current mode to minimize current drain on the vehicle's battery or similar power source. In one embodiment, the electronic device 150 can be a wireless communication device. Examples of such wireless communication devices include, but are not limited to, a mobile telephone (e.g., a cellular telephone, a wide area network telephone, or the like), a mobile radio, a personal digital assistant, a mobile computer, a mobile terminal, an application specific device, a pager, or any other mobile device that can transmit and/or receive wireless communication signals. The electronic device 150 also can be or include a hands-free adapter, a global or similar positioning system, or any other electronic device that may be used within a vehicle. The electronic device 150 also can be any other type of electronic device that requires electrical power from a vehicle and the invention is not limited to these examples. The battery emulator 110 can be installed into a vehicle along with an embedded GPS enabled electronic device 150, and configured to automatically turn on the electronic device 150 when the vehicle is started. The battery emulator 110 can maintain the electronic device 150 in the on state for a desired period, using a timer, after the vehicle is turned off. Accordingly, the present invention allows for a relatively inexpensive electronic communications device 150 which has location services, GPS tracking or similar functionality. Thus, the present invention can provide an inexpensive option that allows companies and other organizations to monitor the present and past locations of their vehicles in real time without draining the vehicle's power source.

Figure 2:
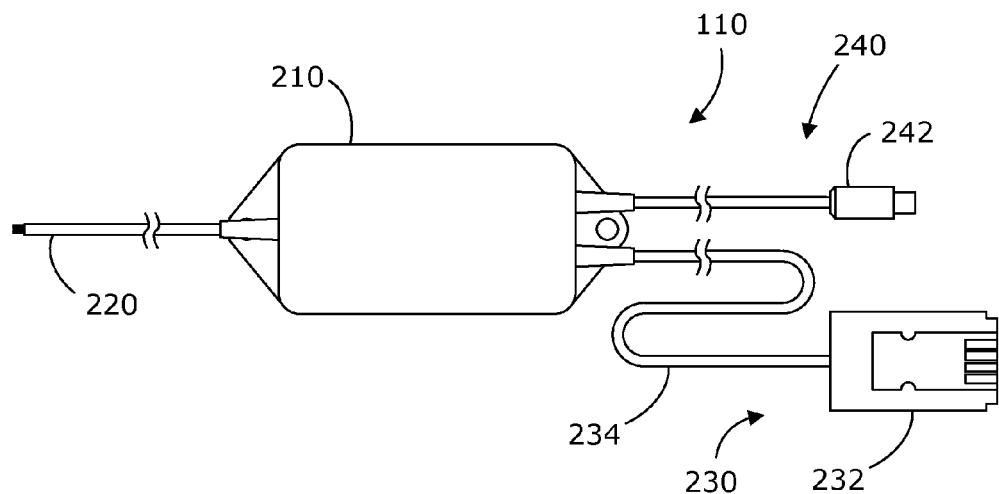
FIG. 2 depicts a dynamic battery emulator, which is useful for understanding the present invention.

FIG. 2 depicts a battery emulator 110 that includes a power control module 210, an input 220 for receiving power from the vehicle, an output 230 for providing power to the electronic device (to emulate its battery or electrical power source), and an output 240 for communicating a control or data signal to the electronic device to selectively turn on and turn off the electronic device. The electrical power source is not limited to batteries, but could be an alternate source of electricity used to power the electronic device.

The input 220 can feature one or more conductors, input terminals, or the like. In one arrangement, the output 230 features a battery replacement and emulator module 232. The battery replacement and emulator module 232 can be configured to replace a battery in the electronic device. Specifically, the battery replacement and emulator module 232 can receive power from the power control module 210 via one or more conductors 234, and provide battery emulated power to terminals within the electronic device that are normally configured to receive power from a battery. The circuits in the module are designed to emulate the electrical properties of an actual battery that powers these devices. This power source can be modified to the specified voltage and power rating of the electronic device. Unless a separate ground connection is provided for the electronic device, in which case only a single conductor 234 may be required, at least two conductors 234 may be provided.

The battery replacement module 232 can be configured with any suitable dimensions and/or features as may be desired for operation in a particular electronic device. In one arrangement, various types of battery replacement modules 232 can be provided, and an installer can select the battery replacement module 232 best suited for installation into the electronic device that is being used by its power requirements.

Figure 3:
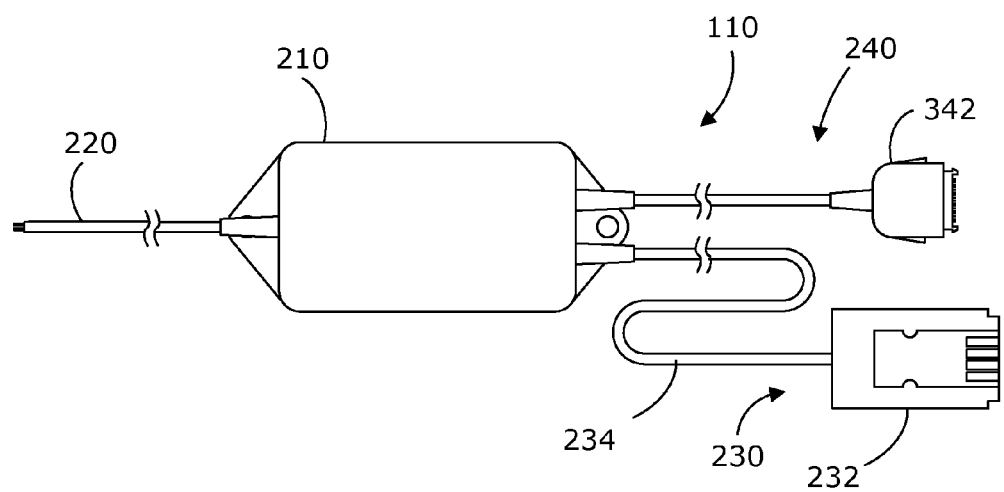
FIG. 3 depicts a power regulator, which is useful for understanding the present invention.

The output 240 can include a connector suitable for interfacing with the electronic device. For example, the output 240 can include a universal serial bus (USB) connector or the mechanical outline of a cellular phone battery with appropriate electrical contacts 242. Referring to FIG. 3, in another arrangement the output 240 of the battery emulator 110 can include a consumer electronics (CE) type connector 342. Still, any other desired connectors can be used and the invention is not limited in this regard. This connector is used to provide signaling to and from the battery emulator and the electronic device, but is not limited to other connections to provide the vehicle's state or other desired inputs.

Figure 4:
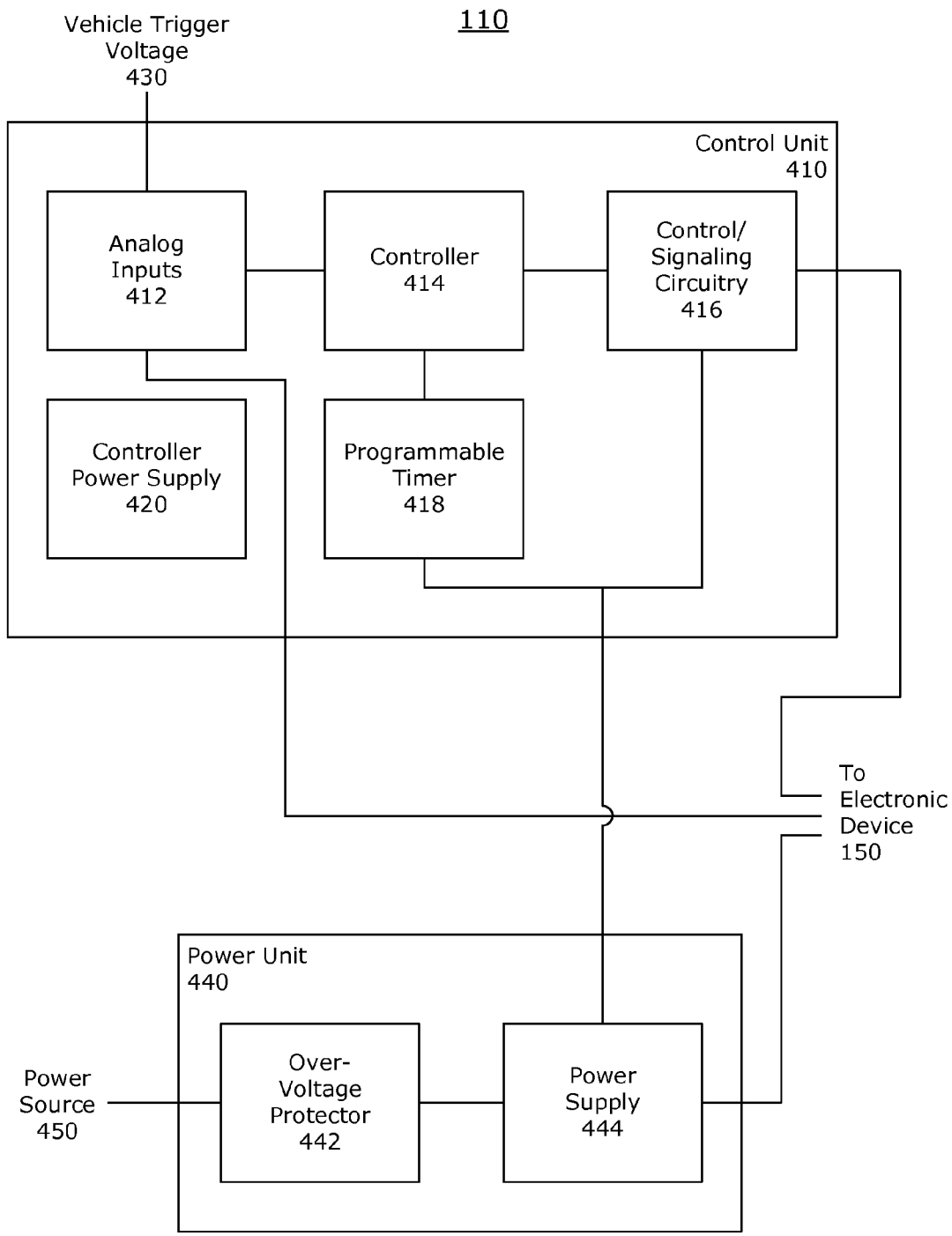
FIG. 4 depicts a block diagram of the dynamic battery emulator, which is useful for understanding the present invention.

FIG. 4 depicts a block diagram of a dynamic battery emulator 110 which includes a control circuit 410 that, based on a vehicle trigger voltage level 430, determines the power state of the vehicle's power on/off state and uses circuitry and/or a software algorithm to determine and control the power state of the electronic device and its associated power source 150. The control circuit 410 can include: analog inputs 412 for measuring the trigger voltage (or similar signaling) to indicate the power state of the vehicle; a controller 414 to make decisions based on input signaling from vehicle and logic algorithm (circuitry and software); a control/signaling circuit 416 to support the controller and to provide appropriate signaling to the electronic device connected to turn the device ON or OFF as defined in the algorithm (determined by decisions from a vehicle's trigger voltage, the current power state of the device, and a timer); a programmable timer 418; and a controller power supply 420.

The control circuit 410 also can include an ignition sense controller and an ignition sensor or similar device to determine the power state of the vehicle. The ignition sense controller can be embodied within the controller 414, and can send commands to the other portions of the dynamic battery emulator 110 and maintain various status flags.

The dynamic battery emulator 110 also can include a power unit 440, which can include an over-voltage protector 442 and a power supply 444. The design allows for operation in different vehicles with different voltage and power systems and has circuitry to prevent power spikes from interfering with proper operation. The power supply is designed to provide the correct power and is optimized to emulate a battery's electrical characteristics such as but not limited to providing a low impedance and high capacitance to the electronic device.

The control unit/circuit 410 senses whether the vehicle's ignition is on or off, and uses power control logic, complex waveforms, or appropriate signaling to control the power state of the electronic device 150 when the vehicle's ignition is turned back on. The control circuit 410 also can turn on and off the power supply 444 of the power unit 440. Based on the ignition sense information, the control unit 410 automatically turns the electronic device 150 back on if the electronic device 150 has been determined to currently be in the off state. If, instead, the electronic device is determined to be in the off state 150 the control unit 410 sends the control logic, complex waveform, or appropriate signaling to turn the electronic device 150 powered on. In this manner, the vehicle's state is used to control the electronic device and its emulated power so as to not unduly drain the vehicle's battery in the vehicle's off state.

Separately, or in combination with the above, the correctness of the ignition sense line installation may be checked by first setting a status flag to a default indication that the ignition sense line is not connected. Thereafter, when a signal is detected on the ignition sense line (such as an indication that the ignition is being turned on), the status flag is changed to indicate a proper installation of the ignition sense line and an indicator is set on the dynamic battery emulator. This indicator could be an LED, sound or vibrator at a set duration, etc. If a changed signal is detected on the ignition sense line, such as an indication that the ignition is being turned off, the timer is enabled. When the timer expires, and there has not been any ignition state change, the indicator is unset on the dynamic battery emulator.

A dynamic battery emulator 110 employing the present invention utilizes a multi-state power management scheme to control its power and the powered state of an attached electronic device 150. The power management scheme looks to the state of the vehicle, the timer value, and the current powered state of the electronic device 150 to determine what actions should be taken. Thus, the power management method is dependent upon both the ignition state of the vehicle, the timer state, and the current powered state of the associated electronic device 150.

A cellular telephone will be used as an illustrative example of the electronic device 150; however, the present invention is not so limited and, as noted, can function with any electronic device that receives power from a vehicle. Further, a hands-free adapter with an incorporated battery charger will be used as an illustrative example of the communications accessory, but it is to be understood that the present invention is suitable for a wide variety of communications accessories, including hands-free adapters, position locators, and the like designed for use within vehicles.

The present invention can be used in a vehicle environment. The dynamic battery emulator 110 can be disposed between the vehicle and the electronic device 150 and communicate and/or monitor the actions of both. As noted, the power unit 440 can receive power from the vehicle's power source 450. The electronic device 150 can be removable from the dynamic battery emulator 110, and the dynamic battery emulator 110 can be securely attached to the vehicle once installed, but this need not be the case.

For purposes of understanding the present invention, a vehicle typically includes a battery and some sort of ignition or power initiation method. The battery or similar device stores electrical energy and provides the same to start and run the vehicle's engine, (or power electric motors in the case of an electric vehicle), and to power any vehicle accessories. In this regard, the term "ignition" means any form of off-to-on switch that may be used to turn a vehicle off and on, respectively. Thus, even though an electrical vehicle may not use an internal combustion engine, it may be turned on and off with its ignition switch.

The dynamic battery emulator 110 of the present invention can be electrically disposed between the vehicle and the electronic device 150 when the electronic device 150 is connected to the dynamic battery emulator 110. The dynamic battery emulator 110 can provide power management via the controller 414, control/signaling circuitry 416 and/or programmable timer 418. The dynamic battery emulator 110 can provide battery emulated power via the power unit 440, audio signals via the analog inputs 412, and an electronic device interface via the control/signaling circuitry 416.

The dynamic battery emulator 110 can operate in a plurality of modes. For example, the dynamic battery emulator 110 can operate in off, sleep, and active modes. In the off mode, the dynamic battery emulator 110 is not dissipating or draining significant power (e.g., less than 3, 2, 1, or 0.5 mA) from the vehicle. In the active mode, the dynamic battery emulator 110 is drawing power from the vehicle (e.g., at between 10-3000 mA) and the internal components of the dynamic battery emulator 110 are typically fully powered. In the sleep mode, the dynamic battery emulator 110 is drawing a limited amount of power from the vehicle (e.g., between 1-10 mA), but all of the internal components of the dynamic battery emulator 110 are either powered down or in a very low power mode.

The control circuit 410 can be a logic circuit that at least partially controls the overall operation of the dynamic battery emulator 110 by controlling the power within the dynamic battery emulator 110 and the power flowing to the electronic device 150 through the dynamic battery emulator 110. For instance, the control circuit 410 may function to power down the various portions of the dynamic battery emulator 110 at selected times, such as by powering down an audio subsystem when the electronic device 150 is not actively involved in a call and the ignition is turned off.

The control circuit 410 can communicate with the electronic device 150 through the interface port, and with various other portions of the dynamic battery emulator 110, such as power unit 440, audio sub-system, etc. The controller 414 of the control circuit 410 can include an operational sleep mode wherein the very low power is consumed. In this sleep mode, the microprocessor preferably monitors for interrupts, such as the IGNIT--STAT(ON) and PHONE STAT(ON) interrupts described below, generated by other portions of the control circuit 410, and assumes a normal awake mode upon detection of such interrupts.

Conversely, the controller 414 can enter the operational sleep mode when the other portions of the dynamic battery emulator 110 and the electronic device 150 if connected, are powered down. Any known logic for the control circuit 410 may be used to implement these functions. Further, controller 414 can include or communicate with, suitable registers for storing and receiving various status flags.

The power unit 440 can operate to convert power from the vehicle to a type suitable for emulating a battery and directly powering the electronic device 150. The audio sub-system can operate to control a speaker and microphone associated with the dynamic battery emulator 110 so as to generate and detect audible sounds. The phone interface port allows communication between various parts of the dynamic battery emulator 110 and the electronic device 150, including the exchange of command and status information.

The ignition sensor monitors the ignition sense line for indications that the vehicle's ignition has been turned on or off as described below. The controller 414 can monitor the current status of the vehicle's ignition and track the present and past history of the electronic device 150 so as to update the relevant status information for the controller 414 to perform power management. In addition, the ignition sense controller also can communicate with the electronic device 150, typically via the interface port, to send power-on and power-off commands. The ignition sense controller may be any suitable logic circuit, for example a state machine, and may be a portion of the controller 414 or may be a separate module. The ignition sense controller can communicate with the controller 414, with the electronic device 150 via the interface port, and with the ignition sensor. The ignition sense controller can utilize one or more timers. For example, the ignition sense controller can utilize an install timer, a safety timer, and an ignition sense timer (IS timer). The install timer and the safety timer can be designed for long periods of time, on the order of one or more hours, days, or weeks (e.g., at least 1, 2, 3, 4, 5, 6, 12, or 24 hours; 2, 2, 3, 4, or 6 days; or 1, 2, 3, 4 or more weeks). The IS timer can be designed for shorter periods of time, such as less than 30, 20, 15, 10, 9, 8, 7, 6, 5, 4, 3, 2, 1, 0.5, 0.4, 0.3, 0.2, or 0.1 minutes. These timers may be of any hardware or software type known in the art.

The dynamic power adapter 110 can be electrically connected to the vehicle by three lines or using other methods. For example, the following methods could be used: optical, wireless, sensors, transducers, and/or electro-mechanical devices. Two direct power lines can connect the dynamic power adapter 110 to the vehicle's battery via the vehicle's main electrical system. These lines are typically referred to as positive and ground, and are typically unswitched by the vehicle—meaning that the dynamic battery emulator 110 may form a circuit with them and pull power from the battery at the discretion of the dynamic battery emulator 110. In addition, the control circuit 410 may be connected to the vehicle by an ignition sense line. This ignition sense line is preferably connected to some switched line in the vehicle such that the switched line is inactive when the vehicle's ignition is not on. However, as described below, the present invention also functions to determine when the ignition sense line is either not installed or incorrectly installed. Thus, the ignition sense line is not always connected to a switched line in the vehicle.

The control circuit 410 can control the operation of the dynamic battery emulator 110. In illustration, the control circuit 410 can have the following states: ISOFF--POFF; ISOFF--PON; ISON--PON; ISON--POFF; IS--TO; WAIT, and AUTO--OFF. At the first initialization, the vehicle ignition sense status flag (VISS) is set to a default of NOT--INSTALLED, and the call status flag (CALLSTAT) is set to a default of IDLE. The VISS flag is intended to be an indicator of the status of the installation of the ignition sense line. The VISS flag has three settings, INSTALLED--OK for a good installation, INSTALL--ERR for an installation error, and NOT--INSTALLED for an indication that the ignition sense line is not installed. The CALLSTAT flag is intended to indicate the status of an active electronic device 150 and may be any number of states, such as idle, calling, connecting, active, hold, waiting, alerting, busy, etc. For purposes of this invention, these states may be grouped into two classes, IDLE and ACTIVE. The IDLE class includes the idle state; the ACTIVE class includes all other states of the active electronic device 150. Of course, a powered off electronic device 150 will have no active state.

Upon first being installed, the control circuit 410 can enter the ISOFF--POFF state. In this state, both the electronic device 150 and the ignition are off. Upon entering the ISOFF--POFF state, the control circuit 410 should be asleep, but monitoring for either the ignition or the electronic device 150 being turned on. For instance, the control circuit 410 could monitor the interface port and check for timeouts. If there are timeouts on the interface port, the control circuit 410 may assume that the electronic device 150 is off. Otherwise, the electronic device 150 may be assumed to be on. A similar type of detection approach may be done with the ignition sense line. Upon receipt of an indication that either the electronic device 150 has been turned on (PHONE--STAT(ON) interrupt) or the ignition has been turned on (IGNIT--STAT(ON) interrupt), the controller 414 of the control circuit 410 can awaken. When the controller 414 is awake, the power draw from the vehicle will be higher. For example, it can be above 25 milliamps. In the sleep mode, the controller 414 draws very little current (e.g., less than 2 or 1 milliamps) while it waits for an action from the vehicle, electronic device, control/signaling circuitry, or programmable timer that turns to controller 414 into the awake mode.

For the typical embodiment being discussed, the ignition sensing functions can be operational when the controller 414 is awake or in sleep mode. The control circuit 410 can, in the ISOFF--POFF state, check for either an IGNIT--STAT(ON) or a PHONE--STAT(ON) interrupt. The IGNIT--STAT(ON) interrupt is generated by the ignition sensor and occurs when a signal is detected on the ignition sense line. The PHONE--STAT(ON) interrupt occurs when a communications channel is established between the electronic device 150 and a remote device.

Upon notice of an IGNIT--STAT(ON) interrupt in the ISOFF--POFF state, the ignition sense functionality of the controller 414 can set the VISS flag to INSTALLED--OK to indicate that at least some signal has been received on the ignition sense line, sets the install timer to a long period such as twelve hours, and enters the ISON--POFF state. For reference, the install timer is intended to assist in determining whether the ignition sense line is properly installed. If the install timer expires, then this is an indication that the ignition sense line, while installed, is not installed properly.

Alternatively, upon notice of the PHONE--STAT(ON) interrupt in the ISOFF--POFF state, the VISS flag is checked. If the VISS flag is not equal to INSTALLED--OK, the safety timer can be set to a long period, such as twelve hours. If the VISS flag is INSTALLED--OK, the safety timer can be set to a shorter period, such as one hour. For reference, the safety timer can be optionally provided to help insure that the vehicle battery is not unduly drained. Additionally, the analog circuitry measures the voltage of the vehicle trigger voltage, if this voltage is below a programmable voltage in the controller 414, then a decision can be made to not power the device. Another option would be to power the device and send the information via the device's signaling connection and wirelessly transmit the low battery condition. Upon expiration of the safety timer, the dynamic battery emulator 110 can stop drawing more than one milliamp of power from the vehicle. The different setting times of the safety timer are provided so that the electronic device 150 is less likely to unexpectedly power down on a user when the ignition sense line is either not installed correctly or not installed at all, or the voltage is below a specified level, but can power down after a shorter period of time to conserve vehicle power when the ignition sense line is installed correctly. After setting the safety timer, the ignition sense functionality of the controller 414 can enter the ISOFF--PON state.

In the ISOFF--PON state the ignition is off, but the electronic device 150 is still on. If, while in this state, the controller 414 can receive an indication of an active electronic device 150 status, the CALLSTAT flag is updated. If, instead, the safety timer expires, the CALLSTAT flag can be checked. If the status is IDLE, the controller 414 can instruct the electronic device 150 to begin powering down (turn off); if the status is not IDLE, the safety timer can be reinitialized to a suitably distant time, such as one hour. Likewise, if a keypress is noted, the VISS flag can be checked and the safety timer can be reinitialized to either twelve hours or one hour depending on whether the VISS flag is INSTALLED--OK or not. At the conclusion of the above situations, the controller 414 can remain in the ISOFF--PON state. The reinitializing of the safety timer helps prevent untimely turning off of the electronic device 150, and is done in the ISOFF--PON state when there is some indication that the electronic device 150 is being actively used.

In contrast, if while in the ISOFF--PON state, the PHONE--STAT(OFF) interrupt is received, indicating that the electronic device 150 has completed a power down, the controller 414 returns to the ISOFF--POFF state. It is anticipated that the phone power down in such a situation will be because of user action; specifically, the user will have manually pressed an on/off switch on the electronic device 150, or otherwise directly indicated to the electronic device 150 that it should turn off, such as by voice command or similar means. This type of "user action" power off is to be contrasted with the "automatic" powering down of the electronic device 150 under the direction of the dynamic battery emulator 110, as discussed in more detail below. In addition, the dynamic battery emulator 110 treats the removal of the electronic device 150 from the dynamic battery emulator 110 as the equivalent to the sending of a PHONE--STAT(OFF) interrupt.

Instead, if while in the ISOFF--PON state, an IGNIT--STAT(ON) interrupt is received, indicating that the vehicle ignition has been turned on, the VISS flag is set to INSTALLED--OK, the install timer is reinitialized to its' set expiration time, the safety timer is disabled without expiring, and the controller 414 enters the ISON--PON state.

In the ISON--POFF state, the ignition is on, but the electronic device 150 is off. If, while in this state, the install timer expires, the VISS flag is changed to INSTALLED--ERR and the controller 414 remains in the ISON--POFF state. If the controller 414 receives an PHONE STAT(ON) interrupt, indicating that the electronic device 150 has completed a power up, the controller 414 goes to the ISON--PON state. If instead, an IGNIT--STAT(OFF) interrupt is received, the VISS flag is set to INSTALLED--OK, the install timer is disabled without expiring, and the controller 414 enters the ISOFF--POFF state.

In the ISON--PON state, both the ignition and electronic device 150 are on. If, while in this state, the install timer expires, the VISS flag is changed to INSTALLED--ERR and the controller 414 remains in the ISON--PON state. If, instead, the controller 414 receives an indication of a call status change, the CALLSTAT flag is updated and the controller 414 remains in the ISON--PON state. If the controller 414 receives a PHONE--STAT(OFF) interrupt, indicating that the electronic device 150 has completed a power down, the controller 414 enters the ISON--POFF state. If an IGNIT--STAT(OFF) interrupt is received, the VISS flag is set to INSTALLED--OK, the install timer is disabled without expiring, the IS timer is set to a very short period of time, such as twenty seconds, and the controller 414 enters the IS--TO state.

In the IS--TO state, the ignition is off and the electronic device 150 is on. If, while in this state, the controller 414 receives an indication of an active electronic device 150 status, the CALLSTAT flag is updated. Likewise, if a keypress is noted, the IS timer 56 is reinitialized to twenty seconds. At the conclusion of the above situations, the controller 414 remains in the IS--TO state. If the PHONE--STAT(OFF) interrupt is received, indicating that the electronic device 150 has completed a power down, the IS timer is disabled without expiring and the controller 414 returns to the ISOFF--POFF state. If an IGNIT--STAT(ON) interrupt is received, the IS timer is disabled without expiring, and the controller 414 enters the ISON--PON state.

If the IS timer expires, the CALLSTAT flag is checked. If the CALLSTAT flat is not IDLE, the IS timer is reinitialized to twenty seconds and the controller 414 remains in the IS--TO state. If the CALLSTAT flag is IDLE, the controller 414 instructs the electronic device 150 to power down, such as by sending a PHONESTATUS(OFF) request to the electronic device 150 via the interface port, and the controller 414 goes to the WAIT state. The instructing of the electronic device 150 to power down is the start of an "automatic" power down.

In the WAIT state, the ignition is off and the electronic device 150 should be in the process of powering down. This state is essentially a wait state between the IS--TO state and the AUTO--OFF state. While in this state, if the IGNIT--STAT (ON) interrupt is received, the controller 414 goes to the ISON--PON state. If call state change occurs, the updated CALLSTAT is checked; if IDLE, the controller 414 remains in the WAIT state, if not IDLE, the IS timer is reinitialized to twenty seconds and the controller 414 reenters the IS--TO state. If the PHONE--STAT(OFF) interrupt is received, indicating a successful power down of the electronic device 150, the controller 414 goes to the AUTO--OFF state. In this situation, the "automatic" power down of the electronic device 150 is complete upon receipt of the PHONE--STAT(OFF) interrupt.

In the AUTO--OFF state, both the ignition 14 and the electronic device 150 are off. This state differs from the ISOFF--POFF state in that it can only be entered by the controller 414 causing the electronic device 150 to turn off after the user turns off the ignition (and the IS timer expires). The primary purpose of this state is to allow the electronic device 150 to be automatically turned on when the vehicle ignition is turned on. If, while in this state, the PHONE--STAT(ON) interrupt is received, indicating that the user has intervened to turn on the electronic device 150, the safety timer is set to one hour and the controller 414 enters the ISOFF--PON state. If, instead, the IGNIT--STAT(ON) interrupt is received, the controller 414 issues an instruction to the electronic device 150 to begin powering up, such as by sending a PHONESTATUS(ON) request to the electronic device 150 via the interface port, and the controller 414 enters the ISON--POFF state.

In the AUTO--OFF mode and the ISOFF--POFF states, the control circuit 410 should be in the sleep mode, thereby reducing the power drain of the dynamic battery emulator 110 to less than one milliamp. In the other modes, the control circuit 410 should be in the active mode.

Overall, the safety timer can be used to ensure that the electronic device 150 is powered off by at least a specified time after the ignition is turned off. The install timer and the VISS flag interact to verify that the ignition sense line is properly installed. The IS timer allows a short waiting period to run after the ignition is turned off before instructing the electronic device 150 to begin powering down. The particular time periods used for these timers in the description above are merely preferred settings and do not represent limitations; instead, a wide variety of timer periods are possible as a matter of design choice.

The controller 414 represents one approach for updating various status flags for use by other processes of the dynamic battery emulator 110. In addition, the ignition sense controller logic described above performs several unique functions. First, the scheme changes the response of the dynamic battery emulator 110 to the ignition being turned on so as to depend not only on the state of the ignition, but also on the history of the electronic device 150. That is, the scheme will automatically turn off an idle electronic device 150 after a short period of time (upon expiration of the IS timer) once the ignition is turned off. Further, the scheme will automatically instruct the electronic device 150 to power on in response to the ignition being turned on, when the scheme is responsible for earlier turning off the electronic device 150. However, in contrast to the prior art, the scheme will not instruct the electronic device 150 to power on when the ignition is turned on in the special case of the user having previously intervened to turn off the electronic device 150. For ease of reference, this feature is called the user priority feature.

Second, the scheme allows for the propriety of the ignition sense line installation to be checked. If not installed, then the VISS flag will remain at NOT--INSTALLED, and the only available states will be ISOFF--POFF and ISOFF--PON. If installed incorrectly, the VISS flag will be set to INSTALLED--ERR when the install timer expires. This normally indicates that the ignition sense line is installed to a non-switched line and is therefore incorrectly installed. If the installed timer expires, even though the ignition sense line is properly installed (such as when the vehicle is a long-haul truck that operates for more than twelve hours continuously), the VISS flag can be rest to INSTALLED--OK before entering the ISOFF--POFF or IS--TO states. If the ignition sense line is improperly installed, the only available states are ISOFF--POFF, ISOFF--PON, ISON--POFF, and ISON--PON. Once the install timer expires, the only available states are ISOFF--POFF and ISOFF--PON. For ease of reference, this feature is called the installation check feature.

Third, the scheme allows for a safety timer to be intelligently set and reset when it is readily apparent that the user is interacting with the electronic device 150. For ease of reference, this feature is called the intelligent safety feature.

While the embodiment described above has the user priority feature, the installation check feature, and the intelligent safety feature, this is not required. Instead, any one of these features may be present while the others are optional. Thus, some embodiments may have the user priority feature only, while others may have the user priority feature and the installation check feature but not the intelligent safety; and still others may have the installation check feature and the intelligent safety, but not the user priority feature, etc.

Thus, with the present invention, the power management of a communications accessory may be set not only in regards to the state of the vehicle ignition, but also to the history of the electronic device 150 attached to the dynamic battery emulator 110. Such a power management scheme allows the electronic device 150 to be automatically instructed to power on by the dynamic battery emulator 110 when the dynamic battery emulator 110 is the cause of the electronic device 150 being powered off. If instead, the user powers off the electronic device 150, the dynamic battery emulator 110 will not turn on the electronic device 150 without user intervention.

Separately or combined therewith, the power management scheme may optionally include a method for determining whether the ignition sense line 74 has been correctly installed.

Finally, from the above description, it should be apparent that the safety timer is used to prevent the electronic device 150 from draining the vehicle battery if the electronic device 150 is for some reason left on in the vehicle for a long time, without having the ignition sense line installed correctly. It should be noted that the safety timer, while preferred, is not required.

Figure 5:
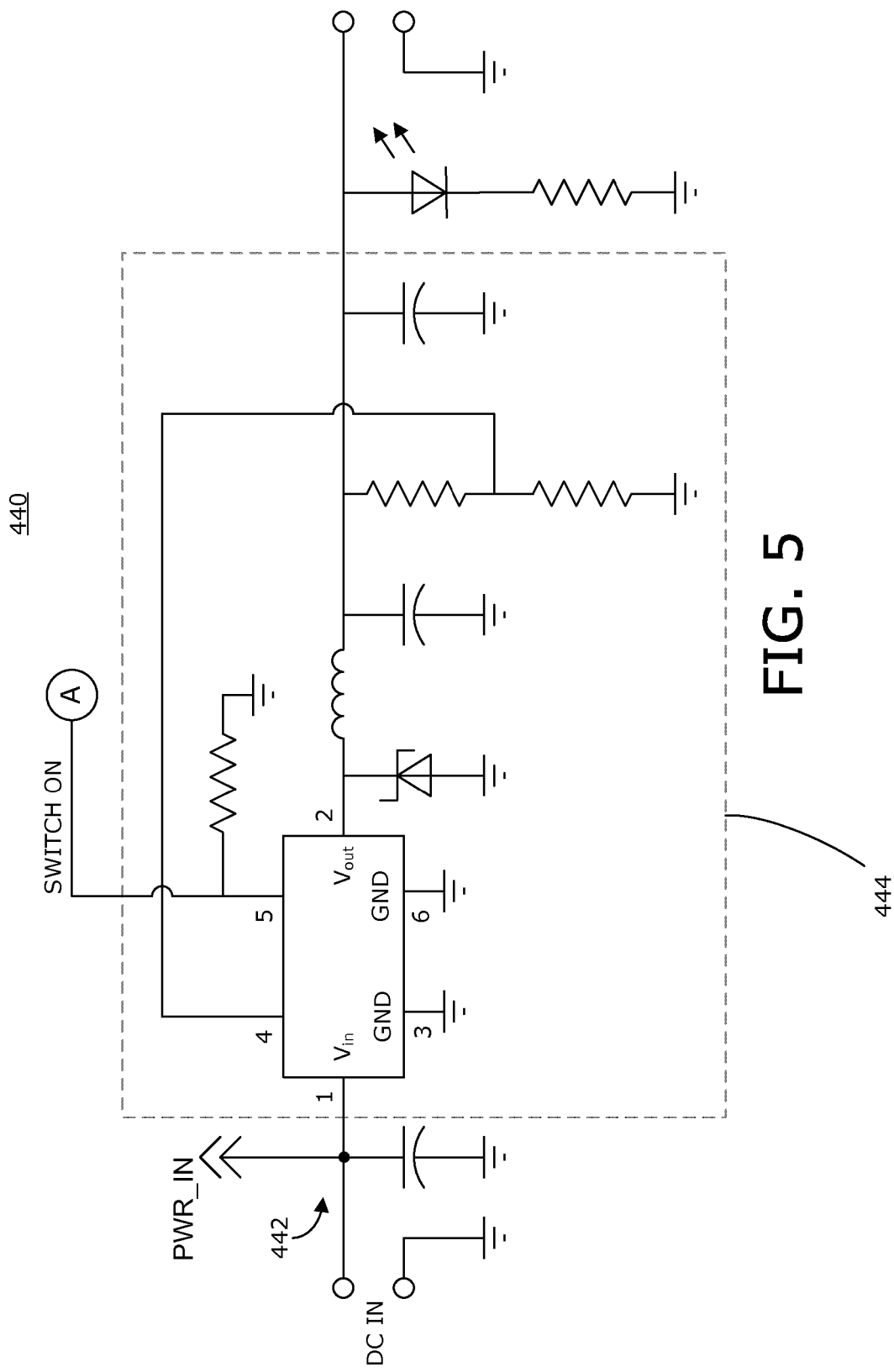
FIG. 5 depicts a schematic diagram of a power unit of the dynamic battery emulator, which is useful for understanding the present invention.

FIG. 5 depicts a schematic diagram of a power unit 440 of the dynamic battery emulator, which is useful for understanding the present invention. The power unit 440 can be a typical inductive switching power supply circuit with feedback, filtering, and indicator. It can be controllable from an external device or circuitry. This is a cost effective solution, but other circuitry could be used to translate the vehicle's power to a voltage and current suitable to power the electronic device. The power unit 440 can provide a constant-voltage over a varying load condition and can supply a large amount of current to the device.

Figure 6:
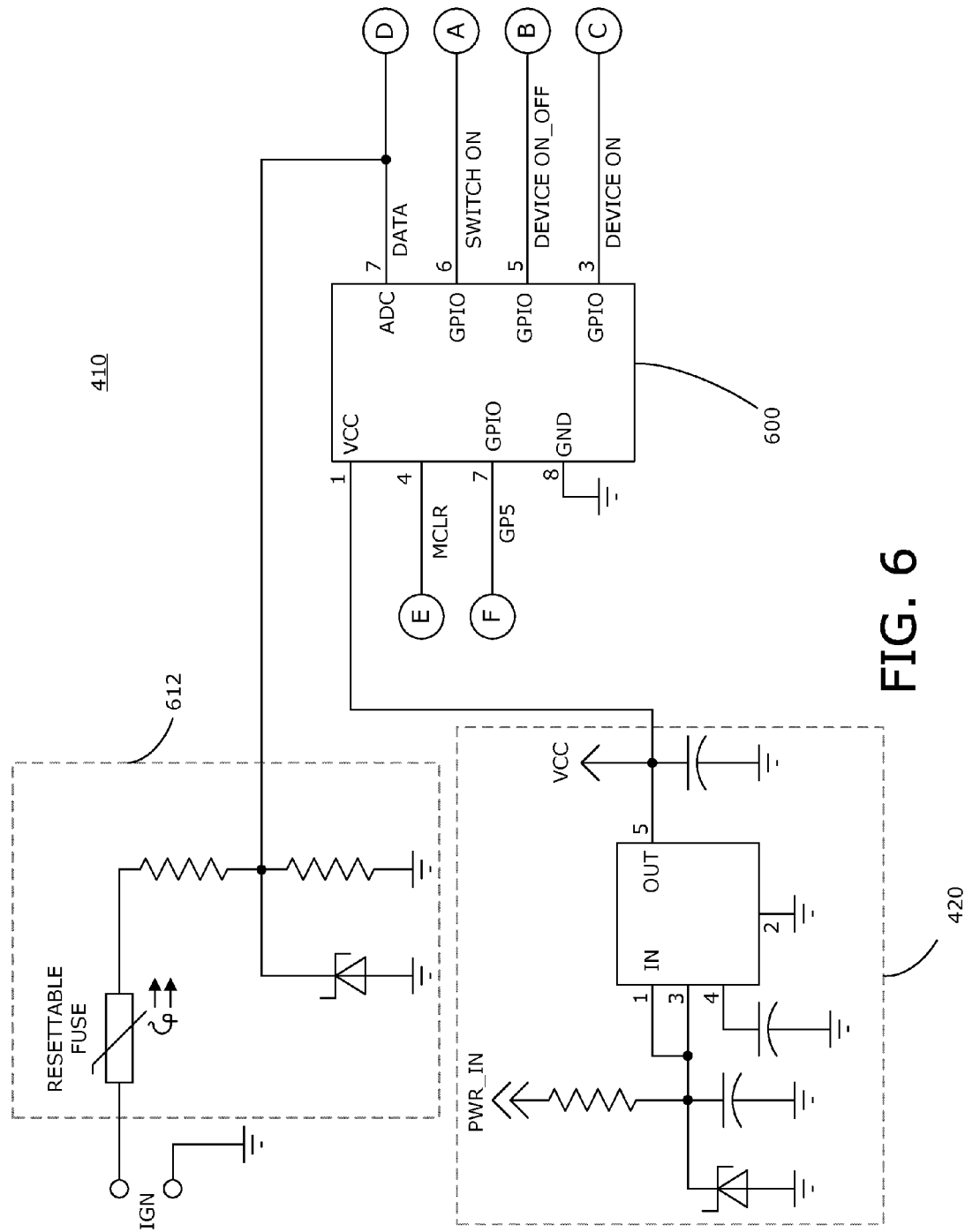
FIG. 6 depicts a schematic diagram of a control circuit of the dynamic battery emulator, which is useful for understanding the present invention.

FIG. 6 depicts a schematic diagram of a control circuit 410 of the dynamic battery emulator, which is useful for understanding the present invention. In this diagram, the analog inputs 412, controller 414, control/signaling circuitry 416 and programmable timer each can be included as components of the controller 600. The controller 600 can make decisions based on input signal and the state of the electronic device.

In one embodiment, the control circuit 410 can include protection circuitry and current limiting of the analog trigger signaling from the vehicle. This circuitry allows a large range of analog signaling to trigger the control algorithms in the controller 600.

A dedicated power supply 420 with current limit and over-voltage protection can be provided for the controller circuitry and algorithms. Again, this allows a large range of voltage input to be applied to the device without damaging sensitive circuitry.

Figure 7:
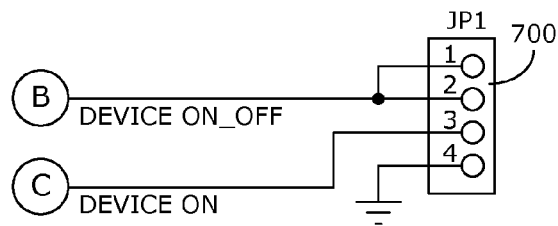
FIG. 7 depicts a connector that connects the dynamic battery emulator to an electronic device, which is useful for understanding the present invention.
Figure 8:
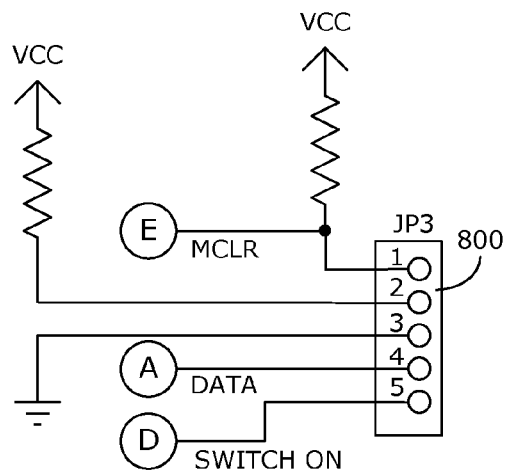
FIG. 8 depicts a connector that connects the dynamic battery emulator to an electronic device, which is useful for understanding the present invention.
Figure 9:
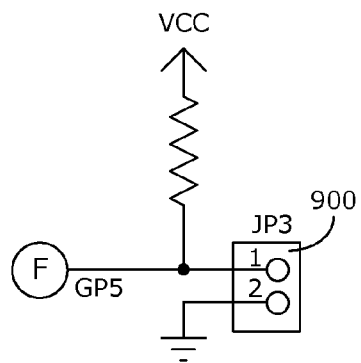
FIG. 9 depicts a connector that connects the dynamic battery emulator to an electronic device, which is useful for understanding the present invention.

FIGS. 7-9 depict various connectors that may be included with the present invention. The connectors can connect to various components depicted in the schematic diagrams of FIGS. 5-6, as indicated by the various connection points A-F.

The connector 700 of FIG. 7 can be a connector interface into the electronic device signaling control.

The connector 800 of FIG. 8 can be an in-circuit programming interface to load software into the microcontroller version of this invention. This allows for easily modifiable algorithms for different customers, electronic devices, or applications. For example, the timing or signaling can be changed in software and programmed in through this interface at any time.

The connector 900 of FIG. 9 can be used as a jumper to select different electronic devices and the appropriate signaling required to turn them ON/OFF or any additional tasks. This can be an analog or digital level to support options for a large number of electronic devices. For example, an analog voltage level of a 8-bit ADC could support 256 or more different voltage levels corresponding to different devices.

Figure 10:
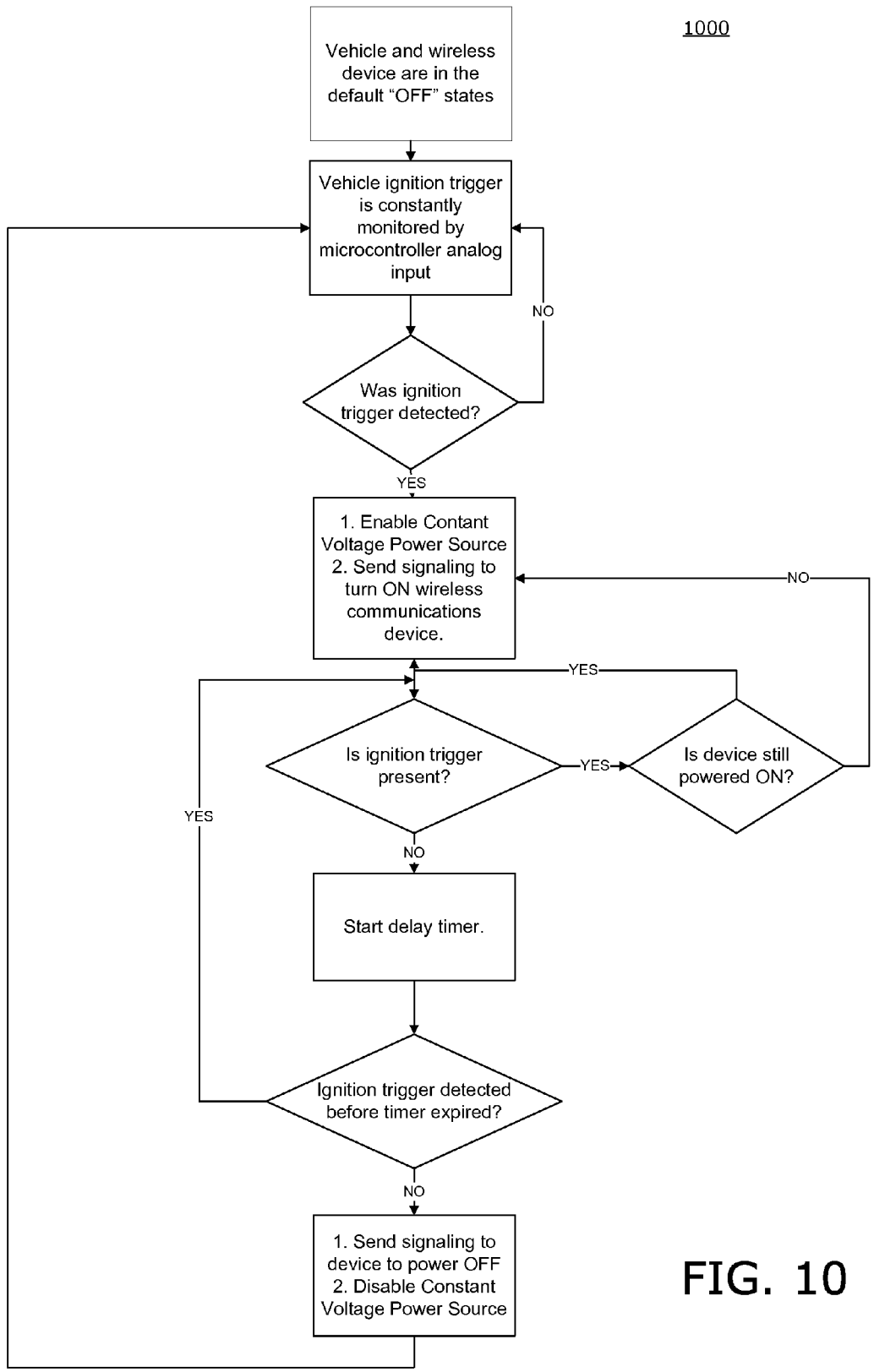
FIG. 10 is a flowchart that is useful for understanding the present invention.

FIG. 10 is a flowchart presenting a method 1000 of controlling the on/off state of an electronic device connected to a vehicle, which is useful for understanding the present invention.

The present invention may, of course, be carried out in other specific ways than those herein set forth without departing from the spirit and essential characteristics of the invention. The present embodiments are, therefore, to be considered in all respects as illustrative and not restrictive, and all changes coming within the meaning and equivalency range of the appended claims are intended to be embraced therein.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising (i.e. open language).

Moreover, as used herein, ordinal terms (e.g. first, second, third, fourth, fifth, sixth, seventh, eighth, ninth, tenth, and so on) distinguish one message, signal, item, object, device, system, apparatus, step, process, or the like from another message, signal, item, object, device, system, apparatus, step, process, or the like. Thus, an ordinal term used herein need not indicate a specific position in an ordinal series. For example, a process identified as a "second process" may occur before a process identified as a "first process." Further, one or more processes may occur between a first process and a second process.

This invention can be embodied in other forms without departing from the spirit or essential attributes thereof. Accordingly, reference should be made to the following claims, rather than to the foregoing specification, as indicating the scope of the invention.

What is claimed is:

1. A dynamic battery emulator for replacing the battery in a portable electronic device when the device is located in or on a vehicle having an electrical system, the dynamic battery emulator comprising:
    a power control module capable of varying its output voltage to adapt to the voltage requirements of an attached portable electronic device;
    an input for conveying electrical power from the vehicle's electrical system to the power control module;
    an output for providing electrical power to the portable electronic device;
    an output for communicating a control signal from the power control module to the portable electronic device to selectively turn on and off the portable electronic device;
    a battery replacement module configured to replace the battery in a portable electronic device and comprising battery replacement circuitry for transferring electrical power from the power control module to the portable electronic device via the output for providing electrical power;
    an ignition sense controller for determining the power state of the vehicle's electrical system; and
    in communication with the ignition sense controller, at least one timer and switch for reducing the conveyance of electrical power from the vehicle's electrical system to the portable electronic device at a predetermined time after the vehicle's ignition or electrical system is turned off;
    the battery emulator being configured to provide electrical power from the vehicle's electrical system to the portable electronic device of between 90-110% of the same voltage, impedance, current, and capacitance as the portable electronic device's battery.

2. The dynamic battery emulator of claim 1, wherein the battery replacement module conveys power from the power control module to terminals within the portable electronic device that are configured to receive electrical power from the portable electronic device's battery.

3. The dynamic battery emulator of claim 1, wherein the ignition sense controller comprises an analog to digital converter for determining the power state of the vehicle's electrical system.

4. The dynamic battery emulator of claim 1, wherein the vehicle's electrical system comprises an ignition system, and wherein the dynamic battery emulator includes discrete circuitry which limits transmission of voltage spikes from the ignition system.

5. The dynamic battery emulator of claim 1, wherein the portable electronic device comprises a location detection system.

6. The dynamic battery emulator of claim 1, wherein the timer's predetermined time is set to allow the portable electronic device to complete its pending data transfer operations before reducing the conveyance of electrical power from the vehicle's electrical system to the portable electronic device.

7. The dynamic battery emulator of claim 1, wherein the dynamic battery emulator comprises and is controllable by a microprocessor which can be controlled by a stimulus or an algorithm.

8. The dynamic battery emulator of claim 1, wherein the dynamic battery emulator includes a sleep mode in which the dynamic battery emulator is configured to draw 10.0 mA or less from the vehicle's electrical system.

9. The dynamic battery emulator of claim 1, wherein the dynamic battery emulator is configured to have less than 5% steady-state voltage ripple and is configured to correct transient responses or load conditions in less than 500 nanoseconds.

10. A method of controlling the on/off state and a controllable power supply of a portable electronic device connected to a vehicle in response to a trigger signal indicating that the vehicle has been turned on, wherein the portable electronic device turns on when the vehicle's electrical system is powered on, and wherein the portable electronic device comprises a plurality of active call states including an idle call state and active call state, the method comprising the steps of:
    starting a first timer in response to the turning off of an ignition of the vehicle;
    automatically instructing the portable electronic device to turn off if the first timer expires and the portable electronic device is in the idle or active call state;
    thereafter, determining whether the portable electronic device was last turned off in response to the timer expiring;
    thereafter, turning off the controllable power supply connected to the portable electronic device after the signaling to turn off the portable electronic device has occurred;
    thereafter, based on a determination that the portable electronic device was last turned off in response to the timer expiring, either:

automatically turning on the controllable power supply attached to the portable electronic device in response to the vehicle's ignition being powered on, the automatically turning on including supplying a control signal to the portable electronic device instructing the portable electronic device to turn on; or leaving the portable electronic device turned off state if the vehicle's trigger signal does not indicate that the vehicle has been turned on.

11. A method of controlling the on/off state of a portable electronic device connected to a vehicle trigger comprising the steps of:

monitoring the voltage of the vehicle trigger;

automatically turning on a controllable power supply that emulates a battery attached to the portable electronic device, sending signaling to the portable electronic device to turn the device "ON", and continually monitoring the device to make sure it is continually "ON"; and upon detection of the vehicle trigger turning off, initiating a timer to count down, wherein, upon expiration of the timer and the vehicle trigger staying "OFF", the portable electronic device is sent a signal to turn it "OFF" and the controllable power supply is shut "OFF";

wherein the voltage measured from the vehicle trigger and the state of the portable electronic device are constantly monitored.

12. The method according to claim 11, wherein a control device monitors the vehicle trigger, controls the controllable power supply, and sends signaling to the portable electronic device to power it up.

13. The method according to claim 11, wherein a control device monitors the vehicle trigger and controls an internal timer circuit, whereby, upon completion of a predetermined time delay, signaling is sent to the portable electronic device to power the portable electronic device "OFF" and to turn "OFF" the controllable power supply.

14. The method of claim 11, wherein the portable electronic device is selected from the group consisting of cellular telephones, personal digital assistants, and satellite cellular telephones.

15. The method of claim 11, wherein the controllable power supply uses circuitry to protect against voltage spikes and excessive power that result from the vehicle's electrical systems, wherein the circuitry comprises a mechanism which disables power delivery from the power supply upon sensing a failed condition and reactivates power delivery upon removal of the failed condition.

16. The method of claim 11, wherein the controllable power supply supplies a clean, low-impedance, and regulated constant voltage with adequate current to supply dynamic loads to cellular phones, satellite phones, and other accessories.

17. The method of claim 11, wherein the controllable power supply utilizes a switching frequency and a feedback loop to provide a constant voltage from an internal reference voltage.

18. The method of claim 11, further comprising the step of electrically connecting the portable electronic device to a communications accessory that automatically provides the control signal in response to the vehicle's ignition system powering off.

* * * * *